(12) United States Patent
Weißmann et al.

(10) Patent No.: US 10,453,767 B2
(45) Date of Patent: Oct. 22, 2019

(54) CONTROL DEVICE AND METHOD FOR MONITORING A FUNCTION OF A SEMICONDUCTOR COMPONENT DURING THE OPERATION THEREOF AND ELECTRICAL ASSEMBLY HAVING A CONTROL DEVICE

(71) Applicant: ZF Friedrichshafen AG, Friedrichshafen (DE)

(72) Inventors: Heinz Weißmann, Auerbach (DE); Bernhard Dömel, Seefeld (DE)

(73) Assignee: ZF Friedricshafen AG, Friedrichshafen (DE)

( * ) Notice: Subject to any disclaimer, the term of this patent is extended or adjusted under 35 U.S.C. 154(b) by 473 days.

(21) Appl. No.: 14/900,977

(22) PCT Filed: Jun. 3, 2014

(86) PCT No.: PCT/EP2014/061413
§ 371 (c)(1),
(2) Date: Dec. 22, 2015

(87) PCT Pub. No.: WO2015/000651
PCT Pub. Date: Jan. 8, 2015

(65) Prior Publication Data
US 2017/0309539 A1    Oct. 26, 2017

(30) Foreign Application Priority Data
Jul. 3, 2013   (DE) .......................... 10 2013 212 925

(51) Int. Cl.
*H01L 21/84*   (2006.01)
*H01L 23/34*   (2006.01)
(Continued)

(52) U.S. Cl.
CPC ............ *H01L 23/34* (2013.01); *G01J 5/0007* (2013.01); *H01L 21/67248* (2013.01); *H02K 11/25* (2016.01); *H02K 11/33* (2016.01)

(58) Field of Classification Search
CPC .............................. G01J 5/0007; H01L 23/34
See application file for complete search history.

(56) References Cited

U.S. PATENT DOCUMENTS

| 6,246,321 B1 * | 6/2001 | Rechsteiner ..... G08B 13/19602 250/338.1 |
| 7,079,972 B1 * | 7/2006 | Wood ...................... G06F 1/206 257/E23.08 |

(Continued)

FOREIGN PATENT DOCUMENTS

| EP | 2 498 391 A1 | 9/2012 |
| GB | 2 388 977 A | 11/2003 |
| KR | 10-2013-0057664 | 6/2013 |

OTHER PUBLICATIONS

International Search Report and Written Opinion dated Aug. 6, in International Application No. PCT/EP2014/061413, English and German languages (11 pp.).

(Continued)

*Primary Examiner* — Muhammad S Islam
(74) *Attorney, Agent, or Firm* — Brinks Gilson & Lione

(57) ABSTRACT

A control device for monitoring a functioning of a semiconductor component during its operation may comprise an input interface configured for receiving a sensor signal corresponding to a contact-less determined temperature distribution on a surface of the semiconductor component, and an evaluation device configured to determine, based on the sensor signal, whether the temperature distribution fulfills a predefined decision criterion corresponding to an operation of the semiconductor component outside a normal operating state. An output interface is designed to issue an emergency (Continued)

signal when the decision criterion is fulfilled, wherein the emergency signal triggers the execution of an emergency measure.

20 Claims, 2 Drawing Sheets

(51) Int. Cl.
*H01L 21/67* (2006.01)
*H02K 11/25* (2016.01)
*H02K 11/33* (2016.01)
*G01J 5/00* (2006.01)

(56) References Cited

U.S. PATENT DOCUMENTS

| | | | | |
|---|---|---|---|---|
| 2005/0114068 | A1* | 5/2005 | Chey | G01K 1/026 702/130 |
| 2006/0050455 | A1* | 3/2006 | Sumida | B60L 3/003 361/56 |
| 2008/0017367 | A1* | 1/2008 | Yazawa | G01R 31/2874 165/287 |
| 2010/0101878 | A1* | 4/2010 | Yoshida | H01L 23/34 180/65.31 |

OTHER PUBLICATIONS

Written Opinion dated Sep. 23, 2015 in International Application No. PCT/EP2014/061413, German language (8 pp.).

* cited by examiner

CONTROL DEVICE AND METHOD FOR MONITORING A FUNCTION OF A SEMICONDUCTOR COMPONENT DURING THE OPERATION THEREOF AND ELECTRICAL ASSEMBLY HAVING A CONTROL DEVICE

This application is a filing under 35 U.S.C. § 371 of International Patent Application PCT/EP2014/061413, filed Jun. 3, 2014, and claims the priority of German Patent Application 10 2013 212 925.4, filed Jul. 3, 2013. These applications are incorporated by reference herein in their entireties.

Exemplary embodiments relate to a control device and a method for monitoring a functioning of a semiconductor component during its operation.

Applications in which a functioning of a semiconductor component is to be monitored during its operation are manifold. By way of example, semiconductor components, such as power semiconductors, age more quickly when they are run at high temperatures. An aging of power semiconductors may also lead, in addition to their destruction, to a displacement of the characteristic line of the semiconductor component, such that, due to aging affects, the components may be operated outside the desired specifications, without this becoming known. With respect to the service life of an electrical assembly that uses semiconductor components or power semiconductors, such as insulated gate bipolar transistors (IGBTs), for example, the monitoring of a functioning of the semiconductor component that is used is desirable, e.g. with respect to the thermal loads to which it is subjected. Typically, in the selection of semiconductor components or power semiconductor chips, it is checked, or they are selected such, respectively, that they reach the desired lifetime through their sizing, without the need for being oversized, in order to accommodate cost considerations.

By way of example, with power semiconductor chips, the lifetime of the chip thus depends on the component temperature of the semiconductor component during its operation, such that the temperature during normal operation is the most critical parameter of the power electronics for the sizing of the semiconductor component, or chip, respectively. Each semiconductor chip is thus subject to wear due to temperature and the electronic parameters. If, for example, an inverter or power inverter is to have the optimal dimensions for a specific application, then, up to now, this has required a precise knowledge regarding the stress load or the thermal load to the semiconductor components. While the electrical parameters, such as the current through a semiconductor component, and the voltage applied thereto during operation, for example, can be relatively easily determined thereby using conventional methods, such as an oscilloscope and current and voltage probes, the measurement, or permanent monitoring, respectively, of the temperature of the semiconductor component, however, can only be achieved with a certain difficulty.

Conventionally, the sizing of the semiconductor components that are used thus occurs with respect to their thermal load, frequently on the basis of the value specified by the manufacturer of the semiconductor component in combination with a simulation of the power loss in the semiconductor component. Even though the aging effects of the semiconductor component could also be taken into account thereby, as a supplementary theoretical model, for example, other geometrical basic conditions, e.g. the effect of a housing potentially thermally encapsulating the semiconductor component, or other neighboring components that generate power loss, cannot be taken into account, or can only be taken into account in part.

The temperature of a semiconductor component is also determined, for example, by means of thermocouple elements that are glued onto the semiconductor component, or are realized inside the semiconductor component or its substrate. The temperature determined by this means is only a selective temperature, meaning that it is the temperature of the semiconductor component at the location of the thermocouple element. Typically, however, the temperature of a semiconductor component during its operation does not increase in a uniform manner over the entire surface of the semiconductor material, or over the entire volume thereof, respectively. This means that the temperature is distributed in a non-uniform manner over the chip or the semiconductor component. This is accompanied with the risk that the chip, or the semiconductor component, respectively, may have a much higher temperature, for example, at a location where the thermocouple element is not attached thereto, than the temperature of the semiconductor chip determined by means of the thermocouple element at its location. This means that possible emergency measures may not be met with the necessary precision if the aging, or a high temperature increase, respectively, does not occur at the location of the thermocouple element. It should be noted thereby that even when a theoretical model of the maximum heating occurring at the semiconductor component may be indicative in the case of a semiconductor regarded individually, this location may change significantly due to the different installation situations already referred to above, such that the reliability of the use of a thermocouple element cannot be ensured for all combinations.

There is thus a need for improving the monitoring of a functioning of a semiconductor component during its operation.

Exemplary embodiments of the present disclosure make this possible, in that a control device is used for monitoring a functioning of a semiconductor component, which control device is designed to process a datum that corresponds to a contact-less determination of the temperature distribution on the surface of the semiconductor component. The control device has an input interface for this purpose, for receiving a sensor signal that corresponds to a contact-less determination of a temperature distribution on the surface of the semiconductor component. An evaluator of the control device serves to determine, based on the sensor signal, whether the temperature distribution makes it possible to determine if the semiconductor component is being operated outside of a normal operating state. The evaluator evaluates the sensor signal in terms of whether it fulfills a predefined decision criterion for this purpose. The control device furthermore makes it possible to issue or generate an emergency stop signal, which results in the execution of an emergency measure if the predefined decision criterion is fulfilled.

This means that, by means of such a control device, the functioning of a semiconductor component can be monitored on the basis of a temperature distribution on the surface of the semiconductor component, such that, if applicable, suitable emergency measures can be taken, if it has been determined that the semiconductor component is being operated outside of a normal operating state. Because a temperature distribution of the temperature on the surface of the semiconductor component is taken into account, excess temperatures occurring on the surface of the semiconductor component can be detected not only selectively, but rather, it may be possible to make reliable and precise determinations regarding the operating state of the semiconductor component when, due to the installation situation of the monitored semiconductor component, the temperature distribution thereof, or the generation of the occurring maximum temperatures, is modified in relation to the semiconductor component regarded individually. In particular, it can be reliably determined whether the semiconductor component has an excessively high temperature, or whether there is an excessively high power loss through the semiconductor component, such that, if applicable, measures can be taken, wherein, at the same time, through observation of the temperature distribution on the surface of the semiconductor component, different structural configurations of sensors, different thermal expansions and effects of possible supplementary heat sinks and suchlike can be automatically detected correctly. The data acquired in this manner, regarding the temperature distribution, can be evaluated by means of exemplary embodiments of control devices, or can be transmitted thereto, which can limit the current flowing through the semiconductor component, for example, if the chip or the monitored semiconductor component overheats, which can lead to a reduction of the temperature inside the semiconductor component as a possible emergency measure. Thus, using exemplary embodiments of the present disclosure, the actual chip temperature, or the actual temperature distribution of the semiconductor component, can be determined, without errors in a fundamental theoretical computing model due to installation conditions being able to cause errors in the results.

According to further exemplary embodiments, the emergency signal triggers the display of an indication that the semiconductor component is being operated outside of a normal operating state. This may enable a user to anticipate an impending malfunctioning of the semiconductor component, or the assembly that uses this component, respectively, in order to avoid the occurrence of the actual malfunction. This emergency measure can then be met, for example, when a specific semiconductor component repeatedly becomes overheated, or when the relevant semiconductor component regularly heats up extremely quickly, which can be regarded as an indication of an impending malfunction, or damage to the relevant semiconductor component. A user can thus be actively informed by the control device regarding overheating that occurs, or an anticipated short remaining service life of the semiconductor component.

According to some exemplary embodiments, the temperature distribution for a surface region is detected by means of at least one sensor, which surface region comprises the entire surface of the semiconductor component, such that, in order to decide whether the semiconductor component is being operated outside a normal operating state or not, the entire surface of the semiconductor component can be used, which can increase the overall diagnosis precision.

According to some exemplary embodiments, the electromagnetic radiation emitted from the surface of the semiconductor component is detected without physical contact, by means of an infrared sensor (IR sensor) that is sensitive to the mid-range infrared spectrum, for example, which is capable of observing an extensive surface region, in space-resolved manner as well, for example. In other words, exemplary embodiments of such sensors could be disposed such that they are suspended over the semiconductor component, individually, or in large numbers, such that they cover the entire surface. By using a sensor that detects the temperature on the basis of the emitted thermal radiation, within the wavelength interval of 3 μm to 50 μm for example, the determination of the temperature, or the course of the temperature, respectively, can occur isolated from the actual semiconductor component, which can enable a more efficient processing in the further signal processing. Furthermore, the use of such sensors enables the determination of the course of the temperature on the surface of the semiconductor component, without loss of surface area in the semiconductor substrate of the semiconductor component itself. With exemplary embodiments in which the semiconductor components are cooled off, in that these semiconductor components are placed on a heat sink in a thermally conductive manner, for example, the reduction of the cooling surface can further be prevented, as would otherwise occur in order to accommodate thermocouple elements on the surface of the semiconductor component.

Through direct observation of the temperature distribution on the surface of the semiconductor component there is no need for a simulation of the component, which may improve the precision of the analysis of the operating state of the semiconductor component, in that imprecisions, which are inherent in a simulation of a current flow in the semiconductor substrate, can be avoided.

For decision making, arbitrary decision criteria can be sourced, based on which it can be determined that the semiconductor component is being operated outside the normal operating state. According to some exemplary embodiments, an absolute temperature for the overall semiconductor component can be determined, in that, with space-resolved determination of the temperature distribution for example, a weighted average value is formed via the individual temperature values corresponding to a respective surface region. One example of a decision criterion that could be the basis for such an analysis would be the exceeding of a temperature value for the integral average temperature determined in this manner.

According to further exemplary embodiments, selective overheating, for example, may be sufficient for regarding the decision criterion as being fulfilled. By way of example, with a sensor that can verify a plurality of temperatures, or a plurality of radiation intensities corresponding to the respective temperatures, in pixels, the decision criterion is regarded as fulfilled when the temperature corresponding to an arbitrary pixel exceeds the predetermined threshold value. It is clear that arbitrary types of decision criteria can be used such that they are adjusted to the specific problem at hand, e.g. they can be formed by temperature average values for a plurality of adjacent pixels, or suchlike.

Insofar as the limiting of a current flowing through the monitored semiconductor component can be implemented as an emergency measure, the lifetime of the semiconductor component may possibly be increased, through controlled current feed, beyond the original specifications for the targeted lifetime defined for the electrical assembly.

According to some exemplary embodiments, power semiconductors in particular are monitored by means of an exemplary embodiment of a control device, because these semiconductors have the inherent problem of aging due to thermal effects. Examples of power semiconductors are power MOSFETs (Metal-Oxide-Semiconductor Field-Effect Transistor), IGBTs, or, expressed in general terms, vertical semiconductor power components. Every semiconductor component, the primary use of which is to be switched from an electrically conductive state to an electrically non-conductive state, in order to connect high currents or high powers from an input in the power semiconductor component, or chip, to an output of the power semiconductor chip, should be regarded as a power semiconductor, as set forth herein.

In particular, exemplary embodiments of assemblies comprise at least six power semiconductors, or semiconductor components, of this type, which are connected to a 3-phase inverter, wherein the functioning of each of the semiconductor components is monitored by an exemplary embodiment of a control device. In particular with the use of inverters, which may find increased use, for example, in the automotive field due to the electrification of motor vehicles, for controlling electric motor operated drives of the vehicle, a malfunctioning of a semiconductor element can be avoided, or at least detected early, by exemplary embodiments of control devices. As a result, it may be possible to avoid a limiting of the mobility of a motor vehicle in question by means of exemplary embodiments of control devices, or electrical assemblies that comprise such a control device.

This means that exemplary embodiments likewise comprise a motor vehicle having an electric motor operated drive and a control device for controlling an electric motor of the electric motor operating drive, wherein the control device comprises an electrical assembly, or a control device according to one exemplary embodiment of the present disclosure. Power semiconductors as set forth herein, or in the manner of the semiconductor components described herein, can also be diodes thereby, in particular when used in inverters, which are typically connected as free-wheeling diodes parallel to the IGBTs that are used when an inverter is incorporated in the circuitry.

According to some exemplary embodiments, the emergency signal causes the current flow through the monitored semiconductor component to be reduced, as a result of which the current flow through a redundant semiconductor component, or a semiconductor component having the same function or a similar function, of a corresponding electrical assembly, is increased, such that the overall available power is not reduced, while at the same time, the premature aging or deterioration of the monitored semiconductor component can be avoided.

Exemplary embodiments of the present disclosure shall be explained in greater detail below, based on the attached figures. Therein:

Figure 1:
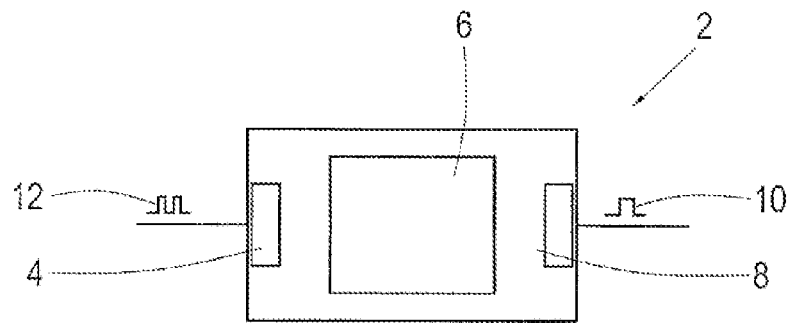
FIG. 1 shows an exemplary embodiment of a control device for monitoring a functioning of a semiconductor component during the operation thereof.

Various exemplary embodiments shall not be explained in greater detail with reference to the attached drawings, in which some exemplary embodiments are depicted. The thicknesses of lines, layers and/or regions may be intentionally exaggerated in the Figures for purposes of clarity.

In the following description of the attached Figures, which only show a few exemplary embodiment examples, identical reference symbols indicate identical or comparable components. Furthermore, collective reference symbols may be used for components and objects that have multiple occurrences in an exemplary embodiment or a drawing, which however, are described collectively regarding one or more features. Components or objects that are indicated with the same or collective reference symbols may be identical, or potentially different regarding individual, numerous or all features, e.g. their sizing, as long not otherwise stated, explicitly or implicitly, in the description.

Although exemplary embodiments can be modified and altered in different ways, the exemplary embodiments in the Figures are depicted as examples, and shall be described in detail herein. It is clear, however, that it is not the intention to limit exemplary embodiments to the respective disclosed forms, but rather, exemplary embodiments should cover all functional and/or structural modifications, equivalents or alternatives that lie within the field of the present embodiments. Identical reference symbols refer to identical or similar elements throughout the description of the Figures.

It should be noted that an element that is "connected" or "coupled" to another element can be connected or coupled directly to the other element, or that there may be intermediate elements. When an element is described as being "directly connected" or "directly coupled" to another element, however, then there are no intermediate elements. Other terms that are used in order to describe the relationship between elements should be interpreted in a similar manner (e.g. "between" in comparison with "directly between," "bordering" in comparison with "directly bordering" etc.).

The terminology used herein is used solely for the description of specific exemplary embodiments and should not limit the exemplary embodiments. As used herein, the singular forms of "one," "a," and "the" should also include the plural forms, as long as the context does not expressly indicate otherwise. Furthermore, it should be clear that the expressions such as, e.g., "contained," "containing," "having," and/or "including," as used herein, indicate the presence of specified features, whole numbers, steps, work sequences, elements, and/or components, but do not exclude the presence or addition of one or more features, whole numbers, steps, work sequences, elements, components and/or groups thereof.

As long as it is not otherwise stated, all of the terms used herein (including technical and scientific terms) have the same meaning that would be attributed to them by an average person skilled in the art in the field to which the exemplary embodiments belong. Furthermore, it is clear that expressions such as those that are defined in general dictionaries are to be interpreted as though they have the same meaning as that meaning that is consistent with their meaning in the context of the relevant technology, and that they are not to be interpreted in an idealized or excessively formal sense, as long as this is not expressly defined herein.

FIG. 1 shows, schematically, an exemplary embodiment of a control device 2 for monitoring a functioning of a semiconductor component during its operation. The control device comprises an input interface 4, which is designed for receiving a sensor signal corresponding to a contact-less determination of a temperature distribution on a surface of the semiconductor component. The control device 2 furthermore has an evaluation device 6, which is designed to determine, based on the sensor signal, whether the temperature distribution fulfills a predetermined decision criterion that indicates an operation of the semiconductor component outside its normal operating state, or corresponds to an operation of the semiconductor component outside a normal operating state.

An output interface 8 is designed for issuing an emergency signal when the decision criterion is fulfilled. The emergency signal 10, indicated schematically here, is designed to trigger the execution an emergency measure. This means that the emergency signal is designed such that it leads to an interaction with further components connected to the control device, such that the relevant emergency measure is triggered. This can result, for example, in the current flowing through the semiconductor component being reduced, or a notification to the user being generated, indicating that the monitored semiconductor component may be operating outside its normal operating state. The emergency signal is to be understood thereby, as a matter of course, as being independent of its concrete implementation, e.g. as a digital or analog signal. The same applies for the sensor signal, which serves to transmit or send the data regarding the temperature distribution on the surface of the monitored semiconductor component. This is independent of the concrete implementation. One example of the transmitting of the relevant data by means of the sensor signal is the direct transmission of a 2-dimensional array of temperature values, insofar as the sensor itself can determine absolute or relative temperature values on the basis of the received radiation intensities. An alternative form of transmitting the relevant data is, for example, a 2-dimensional or 1-dimensional configuration of intensity values, which are obtained or received without contact. This means, alternatively to actual temperature values, intensity values can be transmitted, which directly or indirectly indicate the intensity of the radiation received by a single sensor element. With exemplary embodiments of this type, using knowledge of the radiation sensitivity, or the wavelength dependent sensitivity of the sensor, it is possible to determine to which absolute or relative temperature the concrete transmitted intensity value corresponds.

According to some exemplary embodiments, the sensor is designed, for example, to be able to verify electromagnetic radiation, in particular from the wavelength interval of 3 μm to 50 μm, because, assuming the presence of a black or grey emitter, the radiation caused by the temperature at the surface of the observed semiconductor component is emitted in this wavelength range.

Figure 2:
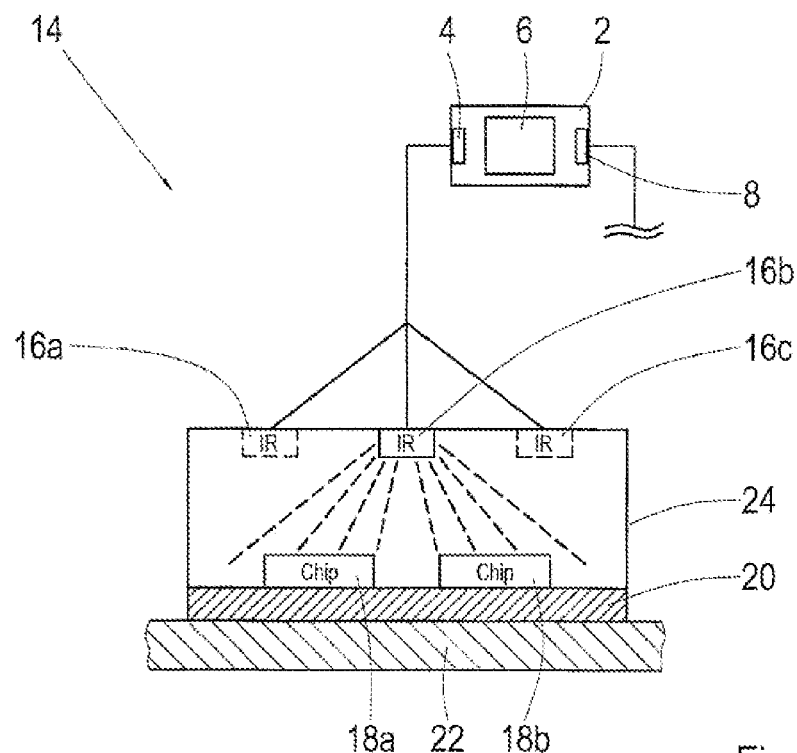
FIG. 2 shows a schematic depiction of a control device according to FIG. 1, and the use thereof for monitoring housed semiconductor components.

FIG. 2 shows, schematically, an electrical assembly 14, comprising an exemplary embodiment of a control device 2, as well as at least one, presently three, sensors 16a-16c, which are connected to the input interface 4 such that they transmit the respective sensor signals that they generate to the input interface 4. Each individual sensor 16a-16c in turn, is designed to detect the temperature distribution on the surface of the semiconductor component without physical contact therewith, in that these verify the thermal radiation emitted from the semiconductor components due to their temperature. In this sense, the sensors 16a to 16c can be referred to in general as infrared sensors as well, because the thermally emitted radiation is generally emitted within the wavelength range of the far infrared (FIR).

In the exemplary embodiment shown in FIG. 2, two semiconductor components 18a and 18b are monitored by means of the control device 2 as well as the sensors 16a-16c connected thereto, which components are disposed on a shared board, or on a "printed circuit board" (PCB), respectively. For the passive or active cooling of the semiconductor components 18a, and 18b, the printed circuit board, in turn, can be mounted on a heat sink 22, as indicated schematically in FIG. 2, in order to discharge the heat losses generated by the semiconductor components 18a ad 18b. As has already been stated, semiconductor components that can be monitored by means of control devices, in particular power semiconductor components, or power semiconductor chips, in particular IGBTs, field effect transistors (FET), diodes or suchlike, can be components that are used in multiple instances, for example, in control devices, as well as in automotive applications. As is depicted in FIG. 2, the chip temperature, or a temperature distribution on a surface of the semiconductor component, respectively, is transmitted by a contact-less thermal sensor on an optical, or infrared, basis. This transmission can occur, for example, on the basis of a heat image, thus based on a 2-dimensional depiction of intensity values that correspond to a temperature on the surface of the semiconductor component, and are evaluated by either the sensors 16a-16c themselves, or by a control device 2 according to some exemplary embodiments. In this respect, some exemplary embodiments of the present disclosure thus pertain to the possibilities for contact-less thermal monitoring of power semiconductor chips, or semiconductor components by means of the use of thermal sensor on an optical, or infrared, basis.

The exemplary embodiments of the present disclosure can enable, in particular, the correct determination of the actual chip temperature, while also taking into account all of the secondary conditions relevant to the installation. If, for example, two components, or semiconductor components, respectively, that generate power loss, exhibit a small spacing to one another, then this can lead to a reciprocal heating of the elements, or it may compromise the fundamental heat discharge for the model of the individual semiconductor components. Geometric installation situations, or similar constellations, could only be taken into account so far to a very limited extent, or only under certain conditions, in thermal models, which is why deviations of the actual situation from fundamental models may occur. These can lead, for example, to the aging of the electric components, or the semiconductor components, not being correctly detected, and as a result, not being able to be correctly taken into account. This in turn, can lead to the functioning that is to be achieved through the use of the semiconductor components, e.g. the power semiconductor, being only insufficiently fulfilled. By way of example, the characteristic line of a semiconductor component, thus, e.g., the switchable current from the semiconductor component, changes as a functioning of the aging and the temperature. Likewise, the temperature of the semiconductor component changes, for example, at the same current flow through the semiconductor component, such as an IGBT, for example, in relation to the already occurring aging effects. This means that a simulation of the temperature based on the current flow exhibits an intrinsic imprecision due to aging.

In order to avoid these disadvantages, or to be able to reduce them, the sensors can be disposed in a floating manner, individually or such that they cover a large area, over the semiconductor component, or its printed circuit board 20, respectively. According to the exemplary embodiment schematically depicted in FIG. 2, the semiconductor components 18a and 18b are housed in a shared housing 24, wherein the sensors 16a-16c are disposed at a side of the housing 24 lying opposite the semiconductor components 18a and 18b, such that a temperature distribution of a respective expanded surface region is detected by the sensors, which surface region comprises the entire surface area of the semiconductor components 18a, b.

With the thermal elements integrated in the semiconductor component, as such, which are disposed in the same semiconductor substrate, or formed, respectively, by the same semiconductor substrate, a possibly significant portion of the surface of the semiconductor component is used for the determination of the temperature, which, particularly in the case of power semiconductors, leads to this surface not being available for conducting power, which can significantly reduce the efficiency of the overall assembly. Furthermore, with such solutions, the determination of the temperature is not separated in terms of the potential, which makes the further processing more difficult. These disadvantages as well can be reduced by exemplary embodiments of the present disclosure.

The use of a closed housing can possibly increase the precision of the determination of the temperature of the semiconductor component, because potentially interfering external radiation is shielded by the housing.

According to some exemplary embodiments, the storage of the occurring temperatures over the entire lifetime cycle of a semiconductor element 18a, b can be carried out by the control device 2 or other downstream evaluation devices, such that, based on the stored measurement values of the past, an appraisal of the aging of the semiconductor component up to this point can occur, e.g. when a long-term temperature increase is detected over a certain time period, which may be caused by systematic aging effects in the semiconductor material.

On the whole, the lifetime of the monitored semiconductor component can be lengthened through controlled current feed, according to some exemplary embodiments.

Figure 3:
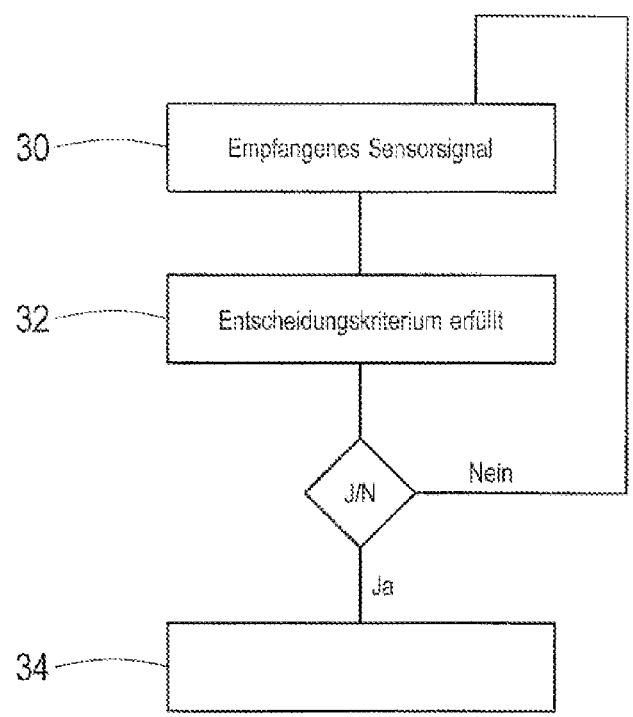
FIG. 3 shows a schematic depiction of an exemplary embodiment of a method for monitoring a functioning of a semiconductor component in the form of a block diagram.

To complete the depiction, FIG. 3 schematically shows an exemplary embodiment of a method for monitoring a functioning of a semiconductor component in the form of a block diagram. A sensor signal is received in a receiving step 30, which signal corresponds to a contact-less determination of a temperature distribution on a surface of the semiconductor component.

In an evaluation step 32, it is determined, based on the sensor signal, whether the temperature distribution fulfills a predefined decision criterion, corresponding to an operation of the semiconductor component outside the normal operating state. When the decision criterion is fulfilled, an emergency signal is emitted in an emergency step 34, triggering the execution of an emergency measure. Alternatively, the method can be optionally restarted, meaning that, when the decision criterion is not fulfilled, a sensor signal can be received again, in accordance with optional further exemplary embodiments, as is schematically indicated in FIG. 3.

Even though the invention is described in the preceding exemplary embodiments and explanations for the most part in conjunction with the electric motor drive, or a use of the exemplary embodiment of the invention in a motor vehicle, it is obvious that further exemplary embodiments are not limited to use in the automotive field. Rather, exemplary embodiments of the invention can be used to great advantage anywhere where power semiconductors are used in conjunction with highly connected, or to be transported, powers. Examples thereof are, among other things, the generation of current from renewable energies, in the field of wind-power and solar or thermal power stations, for example, as well as the operation of stationary power generators in the production field, as well as in the field of stationary drives or suchlike.

When used in the field of motor vehicles, exemplary embodiments also comprise a motor vehicle having an electric motor drive and a control device for controlling an electric motor thereof, wherein the control device comprises a control device for monitoring a functioning of a semiconductor component in accordance with one exemplary embodiment, in order to protect against the loss of the functionality of the electric motor due to a malfunctioning of the control device, or an aging of the semiconductor components used therein.

The features disclosed in the preceding description, the following Claims and the attached Figures may be of importance and may be implemented both individually as well as in any arbitrary combinations for the realization of an exemplary embodiment in its various designs.

Although some aspects are described in conjunction with a device, it is to be understood that these aspects also represent a description of the corresponding method, such that a block or a component of a device is also to be understood as a corresponding method step or as a feature of a method step. Analogously, aspects that are described in conjunction with a method step, or are described as a method step, also represent a description of a corresponding block or detail or feature of a corresponding device.

Depending on the specific implementation requirements, exemplary embodiments of the present disclosure can be implemented in hardware or software. The implementation can be executed using a digital storage medium, e.g. a floppy disk, a DVD, a Blu-Ray disc, a CD, an ROM, a PROM, an EPROM, an EEPROM, or a flash drive, a hard disk or another magnetic or optical memory, on which electronically readable control signals are stored, which can or do interact with a programmable hardware component such that the respective method is executed.

A programmable hardware component can be formed by a processor, a computer processor (CPU: central processing unit), a graphic processor (GPU: graphics processing unit), a computer, a computer system, an application-specific integrated circuitry (ASIC: application-specific integrated circuit), an integrated circuit (IC: integrated circuit), a single-chip system (SOC: system on chip), a programmable logic element or a field programmable gate array having a microprocessor (FPGA: field programmable gate array).

The digital storage medium can thus be machine readable or computer readable. Some exemplary embodiments thus comprise a data carrier having electronically readable control signals, which are capable of interacting with a programmable computer system or a programmable hardware component, such that one of the methods described herein is executed. One exemplary embodiment is thus a data carrier (or a digital storage medium or a computer-readable medium), on which the program for executing one of the methods described herein is stored.

In general, exemplary embodiments of the present disclosure can be implemented as a program, firmware, computer program or computer program product having a program code or as data, wherein the program code or the data is/are effective in this regard, for executing the method when the program runs on a processor or a programmable hardware component. The program code or the data may exist as, among other things, a source code, machine code or byte code, as well as other intermediate codes.

A further exemplary embodiment is also a data flow, a signal sequence or a sequence of signals, which represent the program for executing one of the methods described herein. The data flow, the signal sequence, or the sequence of signals can be configured in this respect, for example, to be transferred via a data communication connection, e.g. via the Internet or another network. Exemplary embodiments are thus also signal sequences that represent data that are suitable for transmission via a network or a data communication connection, wherein the data represent the program.

A program according to an exemplary embodiment can implement one of the methods during its execution, for example, in that it reads this storage location, or writes a datum or data therein, by means of which switching procedures, if applicable, or other procedures are triggered in transistor structures, in amplifier structures or in other electrical, optical, or magnetic components, or other components functioning according to another functioning principle. Accordingly, through reading a storage location, data, values, sensor values or other data can be registered, determined or measured by a program. A program can thus register, determine or measure parameters, values, measurement values and other data by reading one or more storage locations, as well as trigger, cause or execute an action by writing in one or more storage locations, as well as controlling other devices, machines and components.

The exemplary embodiments described above merely represent an illustration of the principles of the present disclosure. It is to be understood that modifications and variations of the configurations and details described herein will occur to persons skilled in the art. For this reason, it is intentional that the described embodiments be limited only by the scope of protection of the most applicable Claim, and not by the specific details that are presented herein in the description and the explanations of the exemplary embodiments.

REFERENCE SYMBOLS 2 control device
4 input interface
6 evaluation device
8 output interface
10 emergency signal
12 sensor signal
14 electrical assembly
16a, b, c sensors
18a, b semiconductor components
20 printed circuit board
22 heat sink
24 housing
30 receiving step
32 evaluation step
34 emergency step

The invention claimed is:

1. A control device for monitoring a semiconductor component during its operation, comprising:
    an input port configured for receiving a sensor signal from at least one sensor located in a housing with the semiconductor component, the sensor signal corresponding to a contact-less determination of a temperature distribution on a surface of the semiconductor component, wherein the temperature of the semiconductor component is controlled by a heat sink, wherein the heat sink is located outside the housing, and wherein the housing is a closed housing such that the housing forms a heat shield between an interior of the housing an exterior environment located outside the housing;
    a processor in communication with the input port, the processor configured to determine, based on the sensor signal, whether the temperature distribution fulfills a predefined decision criterion corresponding to an operation of the semiconductor component outside a normal operating state; and
    an output port in communication with the processor, the output port configured to output an emergency signal when the predefined decision criterion is fulfilled, wherein the emergency signal triggers an emergency measure.

2. The control device according to claim 1, wherein the emergency signal triggers a limitation of a current flowing through the semiconductor component.

3. The control device according to claim 1, wherein the emergency signal triggers a display of an indication that the semiconductor component is being operated outside a normal operating state.

4. The control device according to claim 1, further comprising:
    at least one sensor connected to the input port,
    wherein the at least one sensor is configured to detect the temperature distribution over the surface of the semiconductor component without physical contact with the semiconductor component and to provide the sensor signal corresponding to the temperature distribution.

5. The control device according to claim 4, wherein the at least one sensor is configured to detect a temperature distribution for a surface area comprising the entire surface of the semiconductor component.

6. The control device according to claim 5, wherein the at least one sensor is configured to detect an electromagnetic radiation emitted from the surface area of the semiconductor component.

7. The control device according to claim 6, wherein the sensor is designed to detect the electromagnetic radiation in the wavelength interval of 3 μm to 50 μm.

8. An electrical assembly comprising:
    at least one semiconductor component; and
    the control device according to claim 1.

9. The electrical assembly according to claim 8, wherein the electrical assembly comprises at least six semiconductor components connecting a current flow, the six semiconductor components being connected to a 3-phase inverter, wherein the functioning of each of the semiconductor components is monitored by the control device.

10. The electrical assembly according to claim 8, wherein at least one of the semiconductor components is an insulated gate bipolar transistor (IGBT).

11. The electrical assembly according to claim 8, wherein the at least one sensor is disposed on a side of the housing lying opposite the semiconductor component such that a temperature distribution of a surface area comprising the entire surface of the semiconductor component is detected by the at least one sensor.

12. A motor vehicle having an electric motor powered drive and a control device for controlling an electric motor of the electric motor powered drive, wherein the control device comprises the electrical assembly according to claim 8.

13. A method for monitoring a functioning of a semiconductor component during operation, the method comprising:
    receiving a sensor signal that corresponds to a contact-less determination of a temperature distribution on a surface of the semiconductor component, wherein the sensor signal is received from at least one sensor located in a housing with the semiconductor component, wherein the temperature of the semiconductor component is controlled by a heat sink, wherein the heat sink is located outside the housing, and wherein the housing is a closed housing such that the housing forms a heat shield between an interior of the housing an exterior environment located outside the housing;
    determining, based on the sensor signal, whether the temperature distribution fulfills a predefined decision criterion corresponding to an operation of the semiconductor component outside a normal operating state; and
    issuing an emergency signal that triggers an emergency measure when the decision criterion is fulfilled.

14. The method according to claim 13, further comprising:

determining the contact-less determination of the temperature distribution on the surface of the semiconductor component.

15. An electrical assembly for monitoring a semiconductor component during its operation, the electrical assembly comprising:
- a housing, wherein the semiconductor component is located in the housing, and wherein the housing is a closed housing such that the housing forms a heat shield between an interior of the housing an exterior environment located outside the housing;
- a heat sink coupled to the semiconductor component, wherein the heat sink is located outside the housing;
- at least one sensor located in the housing, wherein the at least one sensor is configured to determine a temperature distribution over a surface without physical contact with the surface;
- an input port connected to the at least one sensor and configured for receiving a sensor signal corresponding to the temperature distribution;
- a processor in communication with the input port, the processor configured to determine, based on the sensor signal, whether the temperature distribution fulfills a predefined decision criterion corresponding to an operation of the semiconductor component outside a normal operating state; and
- an output port in communication with the processor, the output port configured to output an emergency signal when the predefined decision criterion is fulfilled.

16. The electrical assembly of claim 15, further comprising a semiconductor component defining the surface.

17. The electrical assembly of claim 16, wherein the emergency signal triggers a limitation of current flowing through the semiconductor component.

18. A method for monitoring the operation of a semiconductor component, the method comprising:
- determining a temperature distribution over a surface of the semiconductor component during its operation with a senor and sending a sensor signal corresponding to the temperature distribution to a processor, wherein the semiconductor component and the sensor are located within a housing, wherein the temperature of the semiconductor component is controlled by a heat sink, and wherein the heat sink is located outside the housing, and wherein the housing is a closed housing such that the housing forms a heat shield between an interior of the housing an exterior environment located outside the housing;
- evaluating the sensor signal to determine whether the temperature distribution fulfills a predefined decision criterion corresponding to the operation of the semiconductor component outside a normal operating state; and
- sending an emergency signal from an output port when the decision criterion is fulfilled.

19. The method of claim 18, further comprising triggering an emergency measure when the emergency signal is sent from the output port.

20. The method of claim 18, wherein the emergency signal triggers a display of an indication that the semiconductor component is being operated outside a normal operating state.

* * * * *